United States Patent
Dai

(10) Patent No.: US 7,190,217 B2
(45) Date of Patent: Mar. 13, 2007

(54) SYSTEM, METHOD AND APPARATUS FOR PROVIDING GROUND SEPARATION BETWEEN DIFFERENT ENVIRONMENTS

(75) Inventor: Diane Dai, Santa Rosa, CA (US)

(73) Assignee: Verigy Pte. Ltd., Singapore (SG)

( * ) Notice: Subject to any disclaimer, the term of this patent is extended or adjusted under 35 U.S.C. 154(b) by 132 days.

(21) Appl. No.: 10/989,671

(22) Filed: Nov. 15, 2004

(65) Prior Publication Data

US 2006/0103461 A1  May 18, 2006

(51) Int. Cl.
 *H03F 3/45* (2006.01)
(52) U.S. Cl. .................................. 330/69; 330/260
(58) Field of Classification Search ............ None
 See application file for complete search history.

(56) References Cited

U.S. PATENT DOCUMENTS

| | | | |
|---|---|---|---|
| 3,629,719 A * | 12/1971 | Heller et al. | 330/69 |
| 4,595,884 A * | 6/1986 | Miller, Jr. | 330/258 |
| 5,300,896 A * | 4/1994 | Suesserman | 330/69 |
| 5,568,561 A * | 10/1996 | Whitlock | 330/69 |
| 6,411,161 B1 * | 6/2002 | Yamamoto | 330/69 |

OTHER PUBLICATIONS

Syed Jaffar Shah, "Field Wiring and Noise Considerations for Analog Signals", National Instruments, pp. 1-21, Jul. 2000.

Charles Kitchin and Lew Counts, "Chapter II: Inside An Instrumentation Amplifier", A Designer's Guide to Instrumentation Amplifiers, 2nd Edition, pp. 2-1-2-10, Sep. 2004.

www.ecircuitcenter.com, "3 Opamp Instrumentation Amplifier", 4 pages,.2002.

www.allaboutcircuits.com, "Building a differential amplifier", 3 pages, 2003.

"OPA685: Ultra-Wideband, Current-Feedback OPERATIONAL AMPLIFIER With Disable", Burr-Brown Corp., pp. 1-30, Apr. 1999.

* cited by examiner

*Primary Examiner*—Khanh V. Nguyen

(57) ABSTRACT

In one embodiment, ground separation is provided between first and second grounded environments by configuring first and second op-amps of the second grounded environment as buffers, configuring a third op-amp of the second grounded environment to output a difference of its inputs, and coupling the inputs of the third op-amp to outputs of the first and second op-amps. A signal sensing input of each of the first and second op-amps is biased by 1) coupling the signal sensing input to a respective one of first and second impedances, and 2) coupling the first and second impedances to a ground of the first grounded environment. A signal from the first grounded environment is then provided to the signal sensing input of the first op-amp. Related apparatus is also disclosed.

17 Claims, 2 Drawing Sheets

SYSTEM, METHOD AND APPARATUS FOR PROVIDING GROUND SEPARATION BETWEEN DIFFERENT ENVIRONMENTS

BACKGROUND

Providing ground separation between first and second grounded environments (e.g., two pieces of electrical equipment) becomes necessary when electrically connecting the environments would cause one or the other to fail or operate poorly (e.g., due to ground loops). However, past techniques for providing ground separation have often been inadequate when a signal passed between two environments is wideband (e.g., subject to variance from direct current (DC) to 200 MHz).

One technique for providing ground separation between two grounded environments is to couple the environments using a radio frequency (RF) transformer. However, such a technique is typically best-suited to higher, banded frequencies, and DC and low-frequency signals (e.g., signals below about 100 kHz) are typically cut off by the transformer.

Another technique for providing ground separation between two environments is to use a DC block. Similar to an RF transformer, a DC block can isolate DC signals and cut off ground loops. However, also like an RF transformer, a DC block will not pass DC and low-frequency signals.

Yet another technique for providing ground separation between two environments is to float one or both of the environments using a transformer to isolate the environment's power source from ground. However, this technique can be dangerous and is not recommended.

SUMMARY OF THE INVENTION

In one embodiment, ground separation is provided between first and second grounded environments by configuring first and second op-amps of the second grounded environment as buffers, configuring a third op-amp of the second grounded environment to output a difference of its inputs, and coupling inputs of the third op-amp to outputs of the first and second op-amps. A signal sensing input of each of the first and second op-amps is biased by 1) coupling the signal sensing input to a respective one of first and second impedances, and 2) coupling the first and second impedances to a ground of the sensed environment. A signal from the sensed environment is then provided to the signal sensing input of the first op-amp.

In another embodiment, an instrumentation amplifier providing ground separation between a sensed environment and the instrumentation amplifier comprises first, second and third op-amps. The first op-amp is configured as a buffer, receives a signal from the sensed environment at its signal sensing input, and provides a buffered output. The second op-amp is also configured as a buffer and comprises a signal sensing input and a buffered output. First and second resistors respectively couple the signal sensing inputs of the first and second op-amps to a ground of the sensed environment. The third op-amp is configured to receive the buffered outputs of the first and second op-amps and output a difference thereof.

In yet another embodiment, a system comprises first and second grounded environments, and a cable connecting them. The first grounded environment comprises a signal output port. The cable is coupled to the signal output port of the first grounded environment and carries a signal and ground from the first grounded environment to the second grounded environment. The second grounded environment comprises an instrumentation amplifier. The instrumentation amplifier comprises first, second and third op-amps. The first op-amp is configured as a buffer, receives the signal from the first grounded environment at its signal sensing input, and provides a buffered output. The second op-amp is also configured as a buffer and comprises a signal sensing input and a buffered output. The third op-amp is configured to receive the buffered outputs of the first and second op-amps and output a difference thereof. First and second resistors respectively couple the signal sensing inputs of the first and second op-amps to a ground of the first grounded environment.

Other embodiments are also disclosed.

BRIEF DESCRIPTION OF THE DRAWINGS

Illustrative embodiments of the invention are illustrated in the drawings, in which.

DETAILED DESCRIPTION OF AN EMBODIMENT

Figure 1:
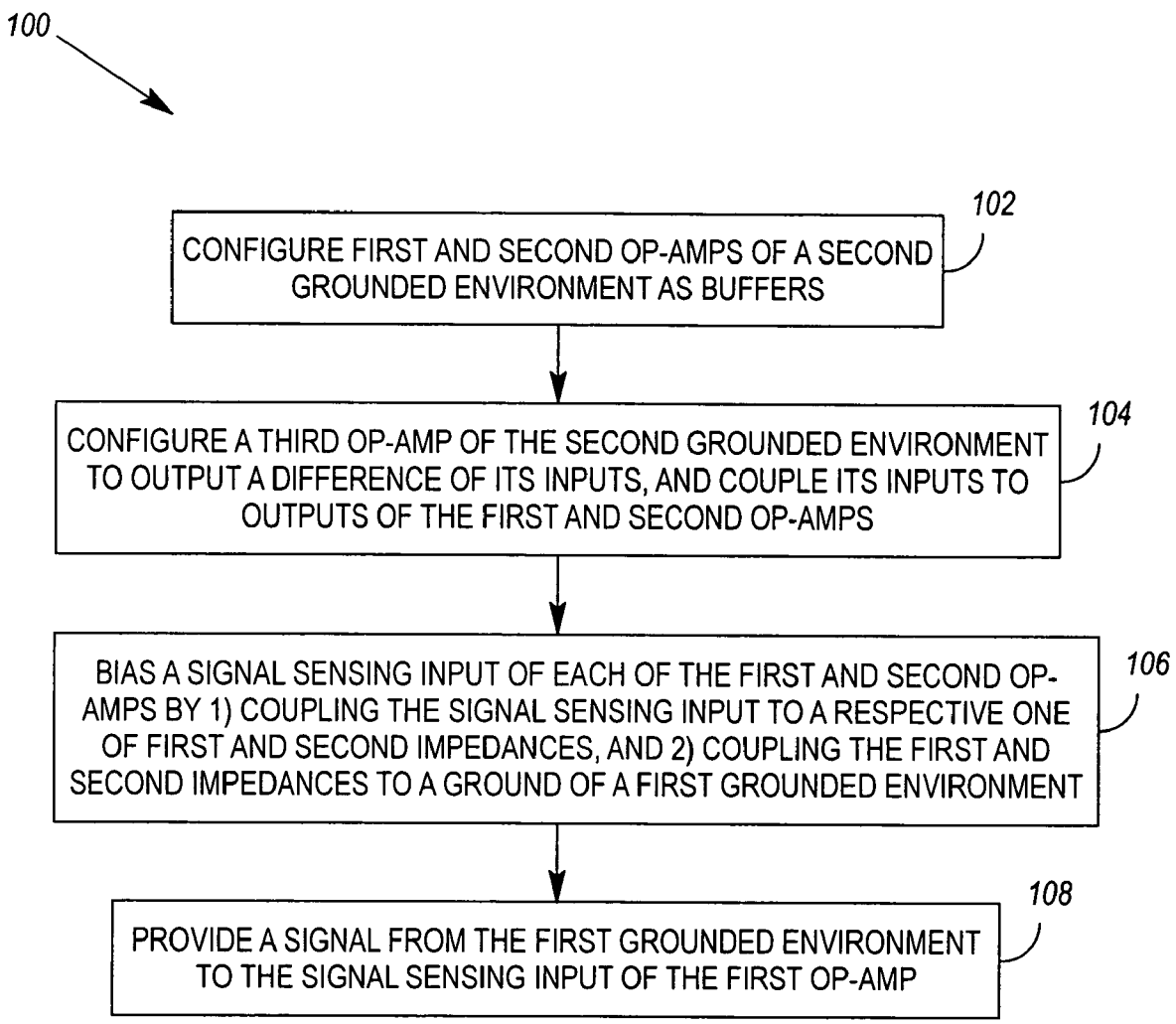
FIG. 1 illustrates a method for providing ground separation between first and second grounded environments.
Figure 2:
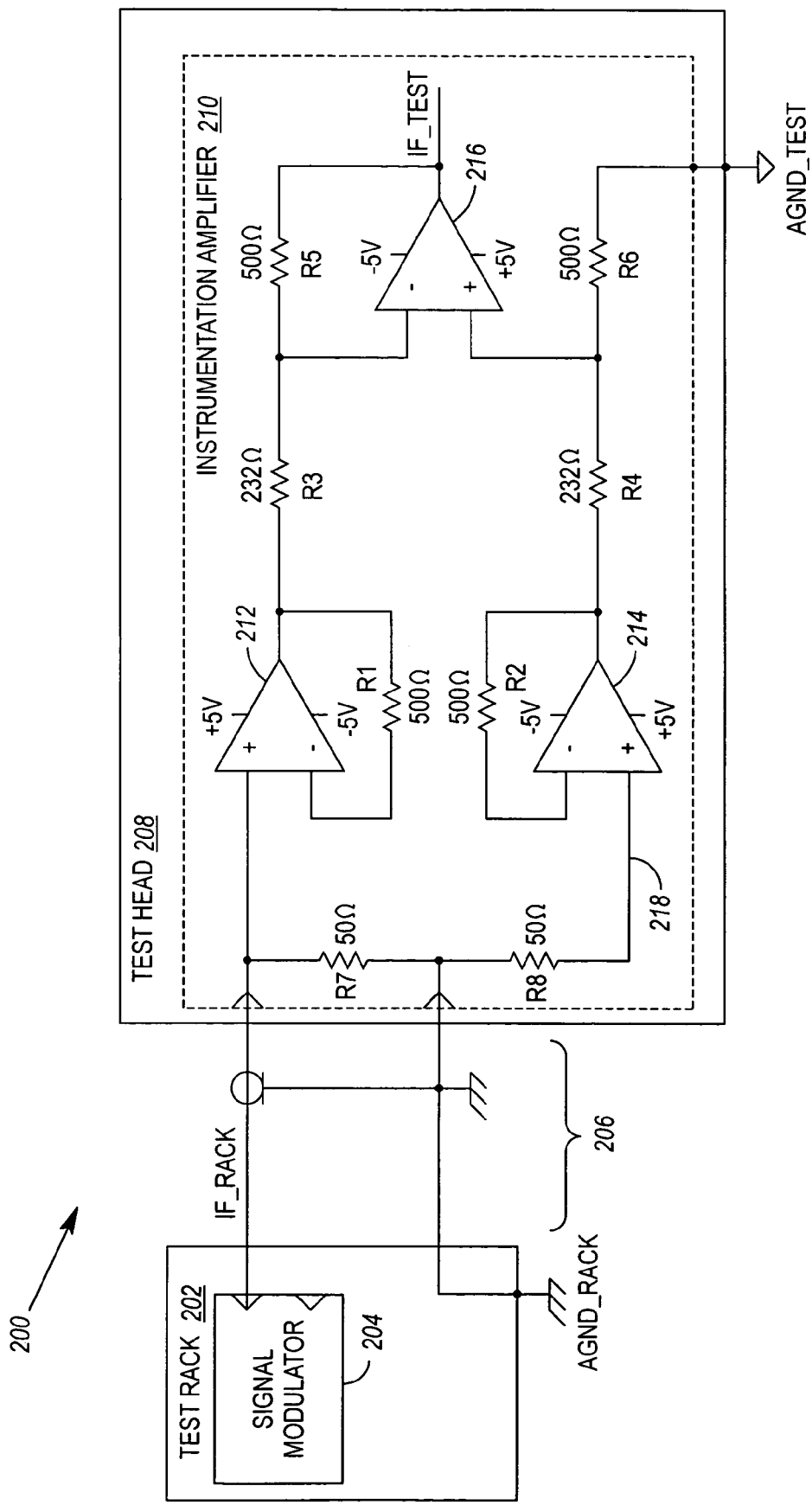
FIG. 2 illustrates an exemplary system comprising first and second grounded environments, a cable connecting the environments, and a means for providing ground separation between the environments.

FIG. 1 illustrates a method 100 for providing ground separation between first and second grounded environments 202, 208 (FIG. 2). Although FIG. 1 illustrates one exemplary order of the method's actions 102–108, its actions may be variously ordered, as will be appreciated by one of ordinary skill in the art. FIG. 2 illustrates an exemplary application of the method 100.

The method 100 comprises configuring 102 first and second operational amplifiers (op-amps) 212, 214 in the second grounded environment 208 as buffers (e.g., by coupling resistor R1 between the inverting input and signal output of the op-amp 212; and by coupling resistor R2 coupled between the inverting input and signal output of the op-amp 214). A third op-amp 216 in the second grounded environment 208 is configured 104 to output a difference of its inputs (e.g., by coupling resistors R3, R4, R5 and R6 as shown in FIG. 2). The inputs of the third op-amp 216 are then coupled to outputs of the first and second op-amps 212, 214. The resistor R6 may be coupled to a reference signal of the second environment 208 and, as shown, the reference signal may be a ground, AGND_TEST, of the second environment 208.

Together, the first, second and third op-amps 212, 214, 216 of the second environment 208 form an instrumentation amplifier 210. Each of the op-amps 212, 214, 216 is supplied with power (e.g., ±5V) referenced to the ground of the second environment 208. Assuming resistor values as shown in FIG. 2, the voltage output of the instrumentation amplifier 210, IF_TEST, is defined by the following equation:

$$\text{IF\_TEST} = -(^{500}\!/_{232})*(\text{IF\_RACK} - \text{AGND\_RACK}) \quad \text{(Equation 1)}$$

The method 100 continues with the biasing 106 of a signal sensing input (e.g., the non-inverting input) of each of the first and second op-amps 212, 214. Each signal sensing input may be biased by 1) coupling the signal sensing input to a respective one of first and second impedances (e.g., one of matched resistors R7 and R8), and 2) coupling the first and second impedances to the ground (AGND_RACK) of the first grounded environment 202. Thereafter, a signal from the first environment 202 may be provided 108 to the signal sensing input of the first op-amp 212.

Although the op-amps 212, 214, 216 of the instrumentation amplifier 210 may take the form of voltage-feedback amplifiers, they are preferably current-feedback amplifiers, since current feedback amplifiers tend to provide higher bandwidth operation and higher third-order intercept (TOI) performance throughout their frequency range. In one embodiment, the op-amps 212, 214, 216 are wideband current-feedback amplifiers such as the Burr-Brown OPA685 or OPA695 (distributed by Texas Instruments, Inc., a Delaware corporation having its principal place of business in Dallas, Tex., USA). Amplifiers such as the OPA685 and OPA695 offer high input low output impedances.

As shown in FIG. 2, the first and second environments 202, 208 may form part of a system 200. A cable 206 may be coupled to a signal output port of the first grounded environment 202 to thereby carry a signal and ground from the first environment 202 to the second environment 208. In one embodiment, the cable 206 is a RF-shielded cable in which its inner core is a signal wire, and a jacket (or layer) surrounding its core is coupled to the ground of the first environment 202. In another embodiment, the cable 206 may comprise twisted signal and ground wires. The cable 206 could also take other forms.

By way of example, the system 200 may take the form of an Agilent 93000 System-On-a-Chip (SOC) tester, in which the first grounded environment 202 is a test equipment rack, and the second grounded environment 208 is an SOC test head. In such an embodiment, the source of the signal carried over the cable 206 may be an intermediate frequency (IF) signal generated by, for example, one port of an in-phase and quadrature (IQ) signal modulator such as the Agilent E9825A. The Agilent 93000 SOC tester and the Agilent E9825A IQ modulator are both distributed by Agilent Technologies, Inc. (a Delaware corporation having its principal place of business in Palo Alto, Calif., USA).

The resistors R7 and R8 provide a current path for biasing the signal sensing inputs of the first and second op-amps 212, 214. In the past, some instrumentation amplifiers have biased the signal sensing inputs of the first and second op-amps 212, 214 using a pair of 10–100 kΩ resistors that connect the signal sensing inputs of these op-amps to the ground of the second environment 208. However, this technique causes the currents at the signal sensing inputs to be a mixture of currents from the first and second environments 202, 208; and this mix of currents tends to reduce the ground separation between the environments 202, 208. By terminating the resistors R7 and R8 with the ground of the first environment 202, the ground separation between the first and second environments 202, 208 may be increased by as much as one or more orders of magnitude.

In some embodiments, the method 100 and instrumentation amplifier 210 may be used to transfer wideband signals between the first and second environments 202, 208. As defined herein, a wideband signal is a signal that may vary within a wide band of frequencies. For example, in one embodiment, a wideband signal may vary between a relatively low-frequency current (or even DC) to a relatively high-frequency current (such as a 100 MHz, 200 MHz or even higher frequency current). In wideband applications, testing has demonstrated that the instrumentation amplifier 210 may provide $\geq 1$ MΩ (one MegaOhm) of ground separation with less than 3 decibels (dB) of signal attenuation at 510 MHz.

The values of the resistors R7 and R8 are preferably matched, and in one embodiment, each resistor may have a value of approximately 50 Ω. In this manner, the resistors R7 and R8 not only provide a means for biasing the first and second op-amps 212, 214, but they also provide standard termination impedances for, and mitigate signal reflection in, one or more cables (e.g., cable 206) that are connected to the first and second op-amps 212, 214. Furthermore, if the signal carried over cable 206 is low-frequency (or even DC), 50 Ω impedances provide only small DC offsets to signals sensed by the first and second op-amps 212, 214.

As shown in FIG. 2, the resistors R7 and R8 may be provided as part of the instrumentation amplifier 210. Alternately, the resistors R7 and R8 may be provided as part of the cable 206. For example, the resistors R7 and R8 may be embedded within a sheath or connector of the cable 206. In any case, the resistors R7 and R8 may be coupled to the ground of the first environment 202 by grounding a portion of the cable 206 to the first environment 202, and then coupling the cable 206 to a connector that is connected to the op-amps 212, 214 of the second environment 208.

In addition to providing ground separation between two differently grounded environments, the instrumentation amplifier 210 provides good common-mode signal rejection. For example, with both of the amplifier's signal sensing inputs being terminated with the ground of the first environment 202, any noise or DC bias appearing in both IF_RACK and AGND_RACK can be extracted (i.e., canceled) from the signal generated by the signal modulator 204.

In one embodiment, the instrumentation amplifier 210 may be provided with a true differential signal (in lieu of a single-ended signal referenced to ground). For example, if the signal IF_RACK represents one component of the differential signal, then the other component of the differential signal could be coupled to the signal sensing input 218 of the second op-amp 214.

What is claimed is:

1. An instrumentation amplifier providing ground separation between a sensed environment and the instrumentation amplifier, the instrumentation amplifier comprising:
   a first op-amp, configured as a buffer, to receive a first signal from the sensed environment at its signal sensing input, and to provide a first buffered output;
   a second op-amp, configured as a buffer, comprising a signal sensing input and providing a second buffered output;
   first and second resistors to respectively couple the signal sensing inputs of the first and second op-amps to a ground of the sensed environment; and
   a third op-amp, configured to receive the buffered outputs of the first and second op-amps and output a difference thereof.

2. The instrumentation amplifier of claim 1, wherein the op-amps are wideband current-feedback amplifiers.

3. The instrumentation amplifier of claim 1, wherein values of the resistors are chosen to provide termination impedances for, and mitigate signal reflection in, one or more cables connected to the instrumentation amplifier.

4. The instrumentation amplifier of claim 1, wherein the resistors each have a value of approximately 50 Ohms.

5. The instrumentation amplifier of claim 1, wherein the signal sensing input of the second op-amp is configured to receive a second signal from the sensed environment, and wherein the first and second signals received from the sensed environment are components of a differential signal.

6. A system, comprising:
   a first grounded environment comprising a signal output port; and a cable, coupled to the signal output port of the first grounded environment, to carry a signal and ground from the first grounded environment to a second grounded environment;

wherein the second grounded environment comprises an instrumentation amplifier, the instrumentation amplifier comprising:

a first op-amp, configured as a buffer, to receive the signal from the first grounded environment at its signal sensing input, and to provide a first buffered output;

a second op-amp, configured as a buffer, comprising a signal sensing input and providing a second buffered output; and a third op-amp, configured to receive the buffered outputs of the first and second op-amps and output a difference thereof; and first and second resistors to respectively couple the signal sensing inputs of the first and second op-amps to a ground of the first grounded environment.

7. The system of claim 6, wherein the resistors are part of the instrumentation amplifier.

8. The system of claim 6, wherein the resistors are part of the cable.

9. The system of claim 6, wherein the op-amps are wideband current-feedback amplifiers.

10. The system of claim 6, wherein values of the resistors are chosen to provide termination impedances for, and mitigate signal reflection in, the cable.

11. The system of claim 6, wherein the resistors each have a value of approximately 50 Ohms.

12. The system of claim 6, wherein the second grounded environment is a system-on-a-chip test head.

13. A method for providing ground separation between first and second grounded environments, comprising:

configuring first and second op-amps of the second grounded environment as buffers;

configuring a third op-amp of the second grounded environment to output a difference of its inputs, and coupling its inputs to outputs of the first and second op-amps;

biasing a signal sensing input of each of the first and second op-amps by, coupling the signal sensing input to a respective one of first and second impedances; and coupling the first and second impedances to a ground of the first grounded environment; and providing a first signal from the first grounded environment to the signal sensing input of the first op-amp.

14. The method of claim 13, wherein the first and second impedances comprise matched resistors.

15. The method of claim 14, further comprising, choosing values of the matched resistors that provide termination impedances for, and mitigate signal reflection in, one or more cables connected to the first and second op-amps.

16. The method of claim 13, further comprising, providing a second signal from the first grounded environment to the signal sensing input of the second op-amp, wherein the first and second signals received from the first grounded environment are components of a differential signal.

17. The method of claim 13, wherein the first and second impedances are coupled to the ground of the first grounded environment by coupling a cable between the first and second grounded environments.

* * * * *